(12) United States Patent
Sitte

(10) Patent No.: US 8,758,932 B2
(45) Date of Patent: Jun. 24, 2014

(54) ARRANGEMENT OF BATTERY POLES OF AN ELECTRIC ENERGY ACCUMULATOR

(76) Inventor: Alexander Sitte, Klagenfurt (AT)

(*) Notice: Subject to any disclaimer, the term of this patent is extended or adjusted under 35 U.S.C. 154(b) by 123 days.

(21) Appl. No.: 13/255,318

(22) PCT Filed: Mar. 4, 2010

(86) PCT No.: PCT/AT2010/000064
§ 371 (c)(1),
(2), (4) Date: Sep. 8, 2011

(87) PCT Pub. No.: WO2010/102314
PCT Pub. Date: Sep. 16, 2010

(65) Prior Publication Data
US 2012/0009442 A1 Jan. 12, 2012

(30) Foreign Application Priority Data
Mar. 9, 2009 (AT) .................... A 376/2009

(51) Int. Cl.
*H01M 2/30* (2006.01)
(52) U.S. Cl.
CPC ..................... *H01M 2/30* (2013.01)
USPC ........................... 429/179; 429/178
(58) Field of Classification Search
CPC ........................................................ H01M 2/30
USPC ............... 429/90, 92, 170, 178, 179
See application file for complete search history.

(56) References Cited

U.S. PATENT DOCUMENTS

| 4,595,641 A | 6/1986 | Giurtino |
| 5,183,712 A * | 2/1993 | Beldock et al. ............... 429/9 |
| 5,399,446 A * | 3/1995 | Takahashi ................. 429/90 |
| 2006/0275656 A1 * | 12/2006 | Feddrix et al. ............. 429/179 |

FOREIGN PATENT DOCUMENTS

| CN | 201060915 Y | 5/2008 |
| EP | 0493253 A1 | 7/1992 |
| EP | 0505080 A1 | 9/1992 |
| EP | 0840383 A1 | 5/1998 |
| KR | 20060020758 A | 3/2006 |

OTHER PUBLICATIONS

International Search Report dated Jul. 8, 2010, corresponding to the PCT application.

* cited by examiner

*Primary Examiner* — Ula C Ruddock
*Assistant Examiner* — Scott J Chmielecki
(74) *Attorney, Agent, or Firm* — Young & Thompson

(57) ABSTRACT

A power accumulator (1) has at least three contacts (5 and 7), the contacts (5 and 7) being partially positive contacts (5) and partially negative contacts (7). The contacts (5 and 7) are arranged symmetrically with respect to the external shape of the power accumulator (1), especially with respect to a longitudinal center plane (3) thereof. In this way, the power accumulator (1) can be inserted in any alignment into a device (consumer or charger) without the danger that the power accumulator (1) will be connected with incorrect polarity.

22 Claims, 14 Drawing Sheets

ARRANGEMENT OF BATTERY POLES OF AN ELECTRIC ENERGY ACCUMULATOR

BACKGROUND OF THE INVENTION

1. Field of the Invention

The invention relates to a power accumulator (electrical energy store).

2. Description of the Related Art

Power accumulators (electrical energy stores) are known in various embodiments. Power accumulators have two contacts, specifically (at least) one positive contact and (at least) one negative contact via which contact can be made with the power accumulator in order to connect it to a consumer, on the one hand, and to be able to charge it in a charging station when it is a rechargeable power accumulator, on the other hand.

In the known embodiments of power accumulators, regardless of whether it is a power accumulator with one or more cells, there is always the problem that the correct polarity must be observed to prevent damage to a device in which the power accumulator is being used, on the one hand, and to prevent damage to the power accumulator, on the other hand, if it is inserted into a charger with incorrect polarity.

This problem applies especially to bar-shaped power accumulators (batteries, monocells and the like) that on one end have a plus contact and on the other end have the negative minus contact.

BRIEF SUMMARY OF THE INVENTION

The object of the invention is to propose a power accumulator in which it is no longer necessary to focus on a correct alignment of its contacts.

This object is achieved according to the invention with a power accumulator that has the features of Claim 1.

Preferred and advantageous configurations of the invention are the subject matter of the dependent claims.

Since, in the power accumulator according to the invention, the contacts are arranged symmetrically with respect to the external shape of the power accumulator, it is unimportant with which alignment it is inserted into a device that it is intended to supply with current, and it is also irrelevant in which alignment it is inserted into a charger when it is a (rechargeable) power accumulator. In other words, the contacts are "mirrored" with respect to the longitudinal center plane of the power accumulator.

The invention can be used in all forms of the power accumulators, quite independently of the shape of the power accumulator, which can be rectangular, round, short or long, and especially also independently of the cross-sectional shape of the power accumulator that can be polygonal (square, rectangular, triangular or else polygonal), likewise round, as is known for monocells ("batteries").

The invention can be used for any type of power accumulators, regardless of their output.

Furthermore, in the invention, regardless of whether the power accumulator has one or several cells, it is solely critical that the contacts, via which the power accumulator can be connected, are arranged symmetrically with respect to the external shape of the power accumulator.

Furthermore, the invention is independent of which design of a power accumulator is used, whether simple zinc-carbon batteries, nickel-cadmium batteries, nickel-metal hydride batteries, lithium-ion batteries, lithium-polymer batteries ("LiPo batteries") or the like. Here, there are one, two or more individual cells in the electrical energy store according to the invention.

In one embodiment, the power accumulator is characterized according to the invention in that the contacts are arranged symmetrically with respect to one plane of symmetry, especially with respect to a longitudinal center plane of the power accumulator. In one simple embodiment, there is one contact essentially in the middle of the (elongated) power accumulator, and there are two other contacts on the ends of the power accumulator. Here, it is irrelevant whether the contact is in the middle of the plus contact (positive contact) or a minus contact (negative contact).

The construction of the contacts is likewise for the most part optional; they can be flush with the outer surface of the power accumulator (of its housing), can be made countersunk or projecting. Finally, within the framework of the invention, it is possible to make the contacts open or hidden.

In the power accumulator according to the invention with its symmetrically arranged contacts, it is advantageous that it can be inserted more or less "blind" into the device, regardless of whether the power accumulator is inserted into a consumer (as an individual cell or battery pack) or for a charging process into a charger.

Within the framework of the invention, it can be provided that the contacts are arranged running around the peripheral surface of the outer shape of the housing, therefore essentially annularly (round rings or polygonal rings), so that also here, better current collection (with "several pressure and/or sliding or spring contacts") is possible.

Within the framework of the invention, an embodiment of the power accumulator is also considered in which especially in the longitudinal center plane of, for example, an elongated power accumulator, there are additional contacts (at least one additional contact, preferably in the form of a "data track") via which contact can be made with a data memory integrated into the power accumulator. In the data memory, data relating to the power accumulator, especially its capacity, voltage and the number of (previous) charging/discharging cycles and the like, can be stored.

For the power accumulator (electrical energy store) according to the invention, it is trivial whether the symmetrical arrangement of the contacts is implemented directly on the electrical cell or on a housing that contains at least one electrical cell for it.

The symmetrical arrangement of contacts in the power accumulator according to the invention can be advantageously further developed in that each contact is made symmetrical (for example, rotationally symmetrical) with respect to one longitudinal axis of the power accumulator, that is, the longitudinal axis that passes through the center of the surface circumscribed by the respective contact or the occupied surface. In one special case, this is a concentric arrangement of the longitudinal axis to the contact or individual ones thereof.

In one preferred embodiment, the power accumulator according to the invention has a contact that is arranged in the center, that runs peripherally and that is preferably made recessed (the contact is protected by the recessed execution) and symmetrically thereto two other contacts with polarity that differs from the center contact, which are located, for example, on the respective end surfaces of the power accumulator or adjacent to them.

In one embodiment of the invention, it is provided that in order to minimize the danger of short-circuiting, one contact lies flat with the outer surface, and the other contact, which lies in the same plane, is made recessed.

When there are one or more "data tracks" that are arranged preferably in the center in the power accumulator according to the invention, in each case two positive contacts (plus poles) and also two negative contacts (minus poles) are arranged symmetrically to the center plane.

If, in the power accumulator according to the invention, there are one or more cells, therefore the cells are surrounded by a housing or the like, internal wiring of the cells results in that they are connected to the respective poles in an electrically conductive manner.

One advantage of the design of power accumulators (electrical energy stores) according to the invention is that the power accumulators can be inserted into consumers or into housing spaces ("battery boxes") more or less "blind" since incorrect polarization is precluded.

In addition, due to the possibility of enlarging the contact surfaces, it becomes possible to achieve at least two collection sites per pole by contacts, especially pressure and/or sliding or spring contacts.

In particular, the power accumulators according to the invention are suitable for larger power accumulators since they allow a practicable and energy-efficient interchangeable-power accumulator system, since changing is simplified to the extent that it is no longer necessary to focus on correct polarity in re-insertion of interchangeable power accumulators.

For example, the power accumulators according to the invention can have an energy unit of 1 KWh (400 volts at 2.5 ampere hours).

Within the framework of the invention, it was also possible for a power accumulator to be made such that it has concealed contacts that are cleared by activation, thus, when the battery is inserted into a consumer, or with which electrical contact is made. This also applies to charging of these batteries, it being ensured here that there is optimum safe handling of the power accumulator, especially of the cells in it, since, for example, charging only takes place when the conditions suitable for this purpose are present. For example, it is important for certain battery types (LiPos) that the charging process is undertaken only at a certain temperature and does not take place at overly low temperatures.

In one exemplary embodiment, the power accumulator according to the invention is characterized in that the contacts are arranged symmetrically with respect to a plane of symmetry, especially a longitudinal center plane of the power accumulator.

In one exemplary embodiment, the power accumulator according to the invention is characterized in that at least one contact is arranged in the region of the plane of symmetry, and two other contacts are arranged at a distance from the plane of symmetry.

In one exemplary embodiment, the power accumulator according to the invention is characterized in that the power accumulator has an elongated shape.

In one exemplary embodiment, the power accumulator according to the invention is characterized in that the power accumulator has a cross-sectional shape chosen from the group consisting of polygonal, rectangular, square, triangular, round and circular.

In one exemplary embodiment, the power accumulator according to the invention is characterized in that the contacts that are arranged at a distance from the plane of symmetry project over the end surfaces of the power accumulator.

In one exemplary embodiment, the power accumulator according to the invention is characterized in that the contacts that are arranged at a distance from the plane of symmetry are arranged countersunk in the end surfaces of the power accumulator.

In one exemplary embodiment, the power accumulator according to the invention is characterized in that the contacts that are arranged at a distance from the plane of symmetry are arranged on the end surfaces and/or the bordering regions of the outer side of the power accumulator.

In one exemplary embodiment, the power accumulator according to the invention is characterized in that the contacts are arranged projecting over the outer surface of the power accumulator.

In one exemplary embodiment, the power accumulator according to the invention is characterized in that the contacts are arranged countersunk relative to the outer surface of the power accumulator.

In one exemplary embodiment, the power accumulator according to the invention is characterized in that the contacts lie in the outer surface of the power accumulator.

In one exemplary embodiment, the power accumulator according to the invention is characterized in that in the region of the plane of symmetry of the power accumulator, there is at least one other contact ("data track") for access to a data memory arranged in the power accumulator.

In one exemplary embodiment, the power accumulator according to the invention is characterized in that in addition to the contact for access to the data memory, there are two contacts of the power accumulator.

In one exemplary embodiment, the power accumulator according to the invention is characterized in that the contacts are made running around the power accumulator.

In one exemplary embodiment, the power accumulator according to the invention is characterized in that at least the negative contact is made running around the power accumulator.

In one exemplary embodiment, the power accumulator according to the invention is characterized in that at least the positive contact is made running around the power accumulator.

In one exemplary embodiment, the power accumulator according to the invention is characterized in that the contact for access to the data memory is made running around the power accumulator.

In one exemplary embodiment, the power accumulator according to the invention is characterized in that the contacts provided on the ends of the power accumulator are made running around the power accumulator.

In one exemplary embodiment, the power accumulator according to the invention is characterized in that the at least one contact that is arranged in the region of the center of the power accumulator is made running around the power accumulator.

The configuration of the power accumulator according to the invention enables constructions that yield different variants with respect to the execution of the power accumulators (battery design) and the battery boxes belonging to them. This is advantageous for series and also for parallel circuits, based on the respective application (electric scooter, electric cars, electric boats, but also buffer storages).

BRIEF DESCRIPTION OF THE DRAWINGS

Other details, advantages and features of the invention will become apparent from the following description of embodiments using the schematic drawings.

Here.

DETAILED DESCRIPTION OF THE PREFERRED EMBODIMENTS

Figure 1:
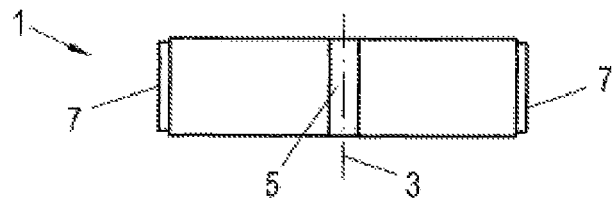
FIG. 1 shows in a side view one simple embodiment of a power accumulator according to the invention.
Figure 2:
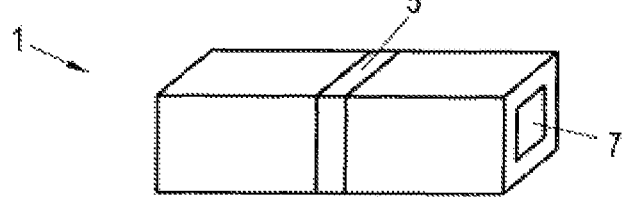
FIG. 2 shows a power accumulator in an oblique view.

A power accumulator 1 shown in FIGS. 1 and 2 is made elongated and in the illustrated embodiment has an essentially square cross-sectional shape. Here, it should be noted that any other cross-sectional shape (square or round) is likewise considered. The power accumulator 1 has a longitudinal center plane (plane of symmetry) 3.

A contact 5, for example the positive contact, is located in the longitudinal center of the power accumulator 1, therefore in the region of the longitudinal center plane 3, and, for example, is made running around the peripheral surface of the power accumulator 1 (annularly). On the two ends of the power accumulator 1, there are two other contacts 7 that are symmetrical to the longitudinal center plane 3. The contacts 7 are negative contacts in the illustrated embodiment.

Here, it is considered that embodiments can also be chosen within the framework of the invention in which the negative contact is the contact 5 and the positive contacts are the contacts 7 on the ends of the power accumulator 1.

In the embodiment shown in FIG. 1, the contacts 7 provided on the ends of the power accumulator 1 are made as contacts that project over the end surfaces.

In the embodiment of a power accumulator 1 shown in FIG. 2, the contacts 7 are made flush with the end surfaces of the power accumulator 1, within the framework of the invention its also being considered that the contacts 7 are made countersunk relative to the end surfaces of the power accumulator 1.

Figure 3:
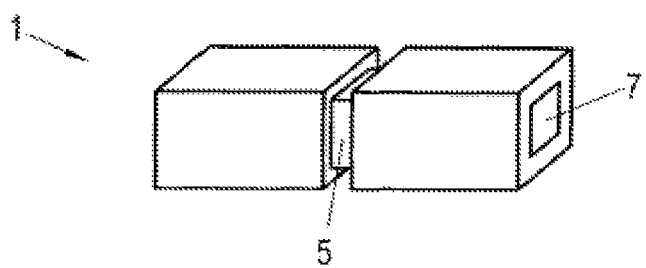
FIG. 3 shows a further embodiment of a power accumulator.

In the embodiment of a power accumulator 1 according to the invention shown in FIG. 3, the contact 5 that is provided in the region of the longitudinal center plane 3 and that can extend around the power accumulator 1 is arranged countersunk relative to the outer surfaces of the power accumulator 1 (therefore lies in a groove). In the embodiment shown in FIG. 3, the contacts 7 provided on the ends of the power accumulator 1 are flush with the end surfaces or countersunk.

Figure 4:
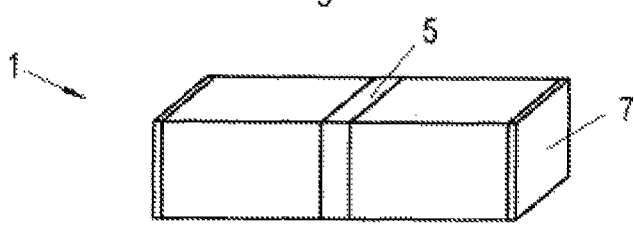
FIG. 4 shows another embodiment of a power accumulator.

In the embodiment shown in FIG. 4, the contacts 7 that are provided on the ends of the power accumulator 1 are made ring-shaped and thus extend, like the contact 5, around the outer surface of the power accumulator 1. The contacts 5 and/or 7 can be provided set back (therefore in "grooves") relative to the outer surface of the power accumulator 1, similarly to the contact 5 of FIG. 3.

Here, one embodiment (not shown) is considered in which the contacts 7 of the embodiment of FIG. 4 and the contact 5 of FIG. 3 are also arranged countersunk relative to the outer surface.

Figure 5:
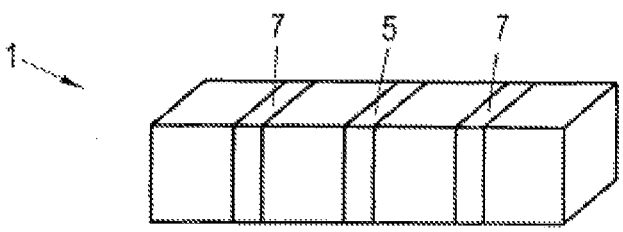
FIG. 5 shows another embodiment of a power accumulator.
Figure 6:
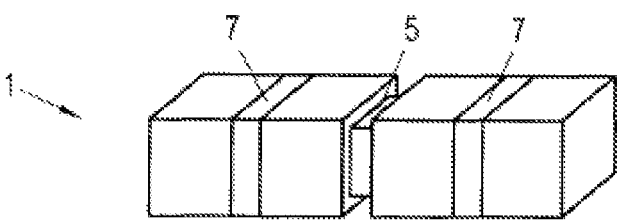
FIGS. 6 and 7 show two other embodiments of power accumulators according to the invention.

FIG. 5 shows another embodiment in which the contacts 7 are arranged symmetrically to the longitudinal center plane 3, but are arranged offset from the end surfaces of the power accumulator 1 toward the center (longitudinal center plane) 3. In the embodiment shown in FIG. 5, the contacts 7 and/or the contacts 5 are also arranged countersunk relative to the outer surface of the power accumulator 1, as is shown for the contact 5 in FIG. 3. Thus, for example, FIG. 6 shows an embodiment in which proceeding from FIG. 5, the center contact 5 is arranged countersunk relative to the outer surface of the power accumulator 1.

Figure 7:
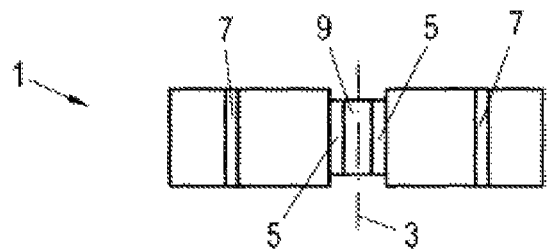

The embodiment of a power accumulator 1 according to the invention shown in FIG. 7 has contacts 5 arranged symmetrically to the longitudinal center plane 3 and likewise symmetrically arranged contacts 7, the contacts 7 in this embodiment being arranged offset relative to the ends of the power accumulator 1 toward the longitudinal center plane 3. The contacts 7 can, however, also be made on the ends and can have an embodiment as is shown in FIG. 1, 2 or 4.

In the embodiment shown in FIG. 7, in the power accumulator 1 there is a data memory with which contact can be made via at least one contact 9 ("data track"). Here, in the embodiment shown in FIG. 7, the arrangement is chosen such that laterally next to the contact 9 for the data memory, there are two contacts 5 that are arranged symmetrically to the longitudinal center plane 3. When the data memory is assigned more than one contact 9, they can be arranged symmetrically to the longitudinal center plane 3.

Figure 15:
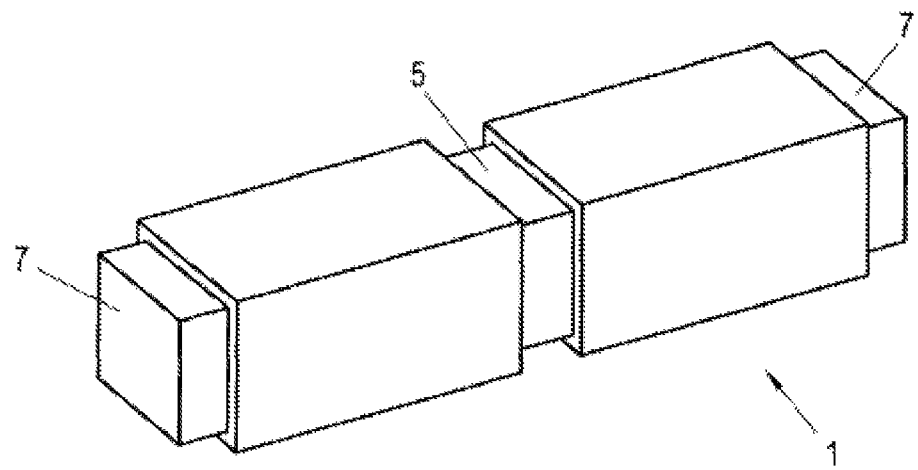
Figure 16:
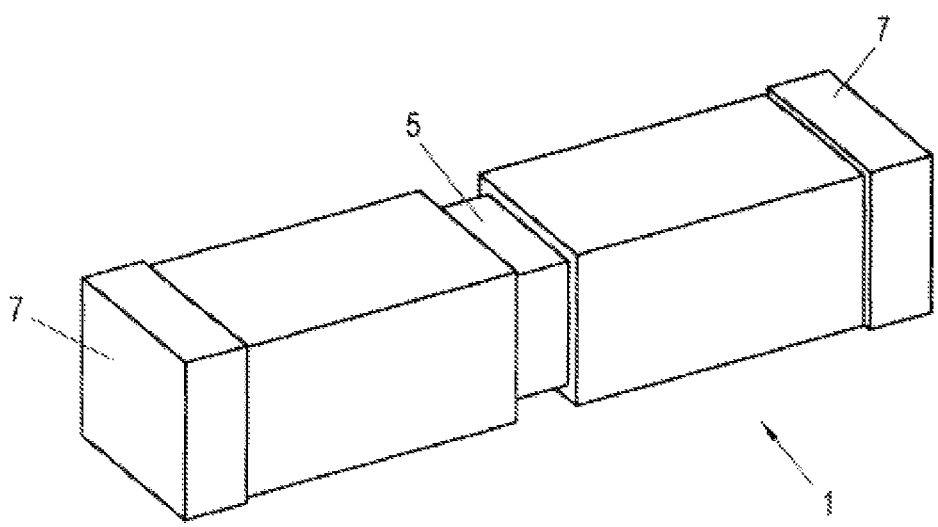
FIG. 16 shows another embodiment of a power accumulator according to the invention.
Figure 17:
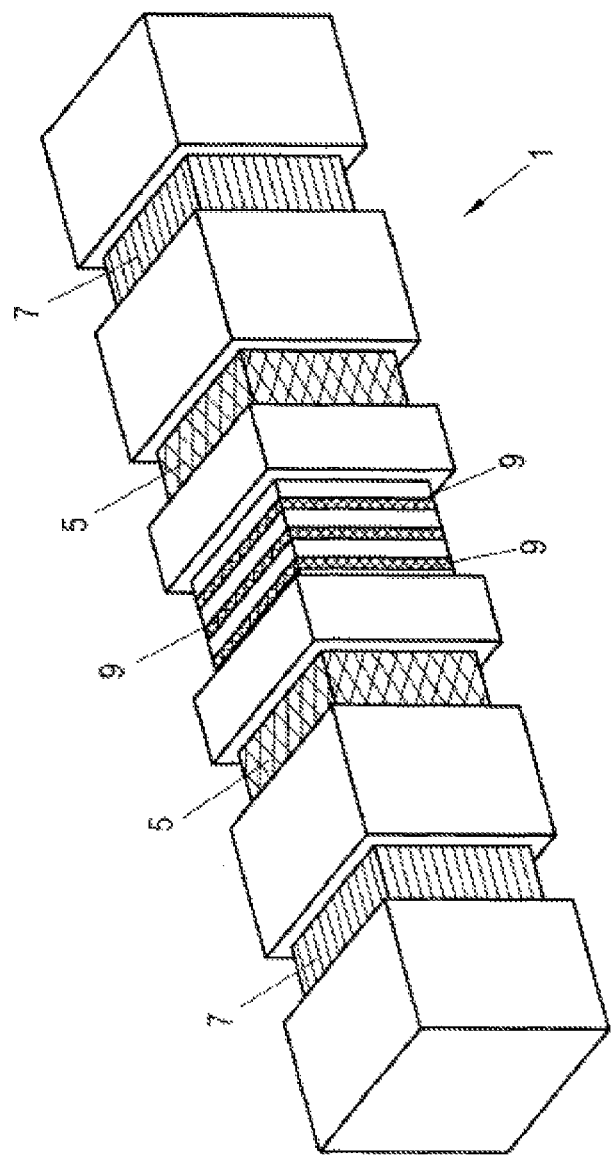
FIG. 17 shows one embodiment of a power accumulator according to the invention with data tracks and peripherally running recessed pole contacts.

A data memory can also be implemented in the other embodiments of the invention (for example, those of FIGS. 1 to 6 and FIG. 10 as well as FIGS. 15 to 17).

It should be pointed out that in each of the embodiments shown in the drawings, a modification can be made such that there is not only one contact 5, but similarly as shown in FIG. 7 or FIG. 17, there are two contacts 5 that are arranged symmetrically to the longitudinal center plane 3 of the power accumulator 1, and therefore have identical distances from this plane.

Figure 8:
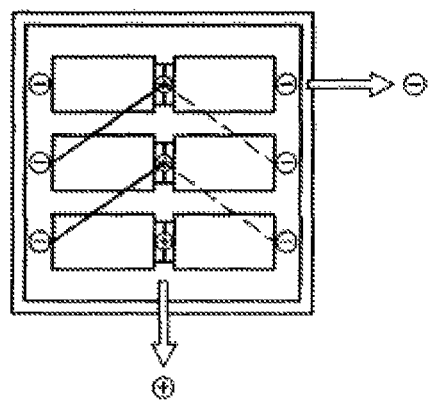
FIG. 8 shows one possible embodiment of an arrangement for accommodating power accumulators according to the invention.
Figure 9:
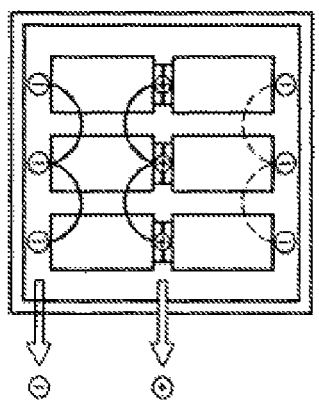
FIG. 9 shows another embodiment of this arrangement.

FIGS. 8 and 9 show devices for accommodating several power accumulators 1 according to the invention. Here, the embodiment shown in FIG. 8 is made such that the power accumulators 1 are connected in series in order to increase the voltage.

In the embodiment shown in FIG. 9, the circuit is chosen such that the power accumulators 1 are connected in parallel so that the capacity increases.

It is common to all previously described variants (embodiments) of a power accumulator according to the invention and also the power accumulators described still further below that they can be used without loose or hanging cables or clips for electrical contact-making.

It is possible to connect the power accumulators according to the invention in the consumer directly or via battery boxes (receiving spaces) or other holding devices to consumers and/or chargers simply via pressure contacts or sliding contacts.

The advantages of the power accumulators according to the invention and the symmetrical arrangement of contacts of the power accumulators according to the invention make them especially well suited for prompt and reliable use in cyclic operation of electrical power accumulators. This is especially the case when in a power accumulator according to the invention, more than one cell, for example, two, three, or more cells, are contained and internally wired in a fixed manner.

Figure 10:
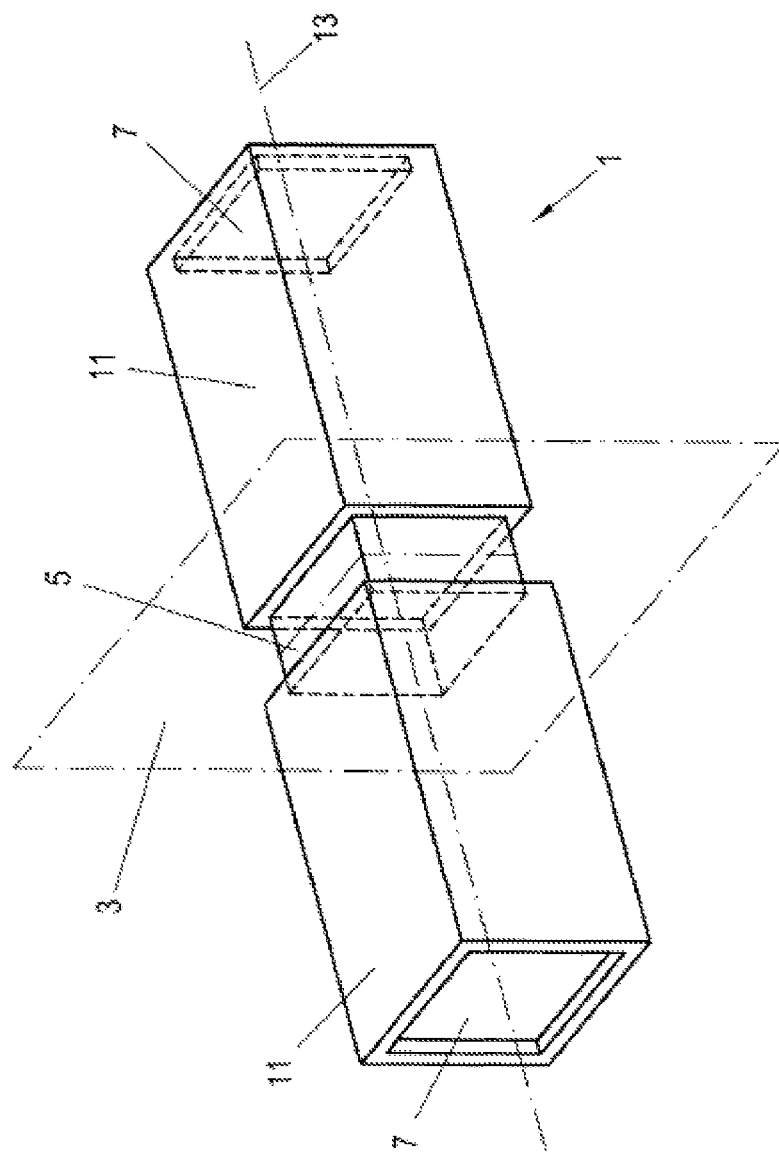
FIG. 10 shows in an oblique view a simple embodiment of a power accumulator according to the invention with an illustrated plane of symmetry and a likewise illustrated center axis.

The embodiment of a power accumulator 1 according to the invention shown in FIG. 10 has a longitudinal center plane (plane of symmetry) 3 and has one longitudinal axis 13. In the embodiment shown in FIG. 10, the power accumulator according to the invention has an essentially square cross-sectional shape—as mentioned—with also other cross-sectional shapes (square, round or with rounded edges) likewise being considered.

A contact 5, for example the positive contact, is arranged in the longitudinal center of the power accumulator 1, therefore in the region of the longitudinal center plane 3 and symmetrical to the latter. In the embodiment shown, the contact 5 is made ring-shaped and is made countersunk relative to the outer surface of the power accumulator 1, therefore lies annularly in a groove. On the two ends of the power accumulator 1, there are other contacts, in the example the negative contacts 7, likewise symmetrical to the longitudinal center plane 3 and also symmetrical to the contact 5. They are connected to one another within the electrical power accumulator 1 and are externally arranged doubled flat.

Figure 11:
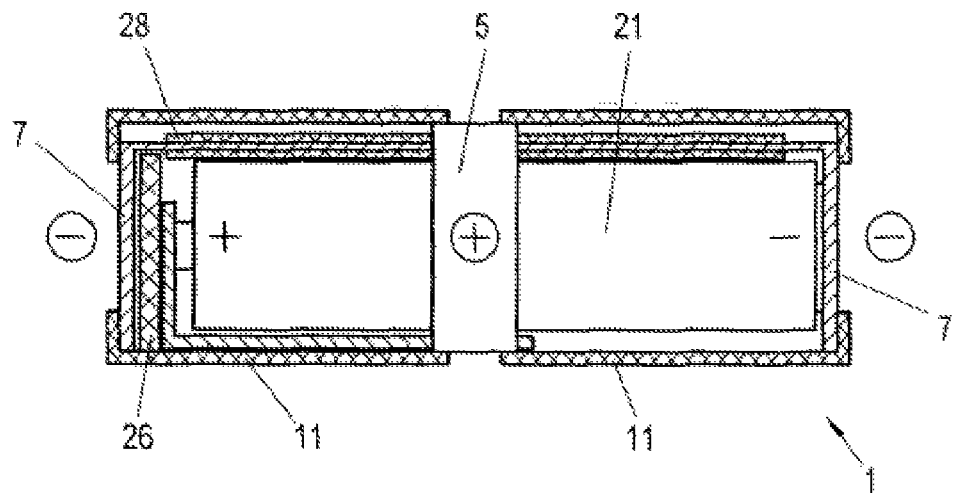
FIG. 11 shows in a section one embodiment of a power accumulator according to the invention with one cell.

In the cross-section of FIG. 11, it is shown how a power accumulator 1 according to the invention can be made with a single, internally arranged monocell 21 (for example, an NiMH cell).

Figure 12:
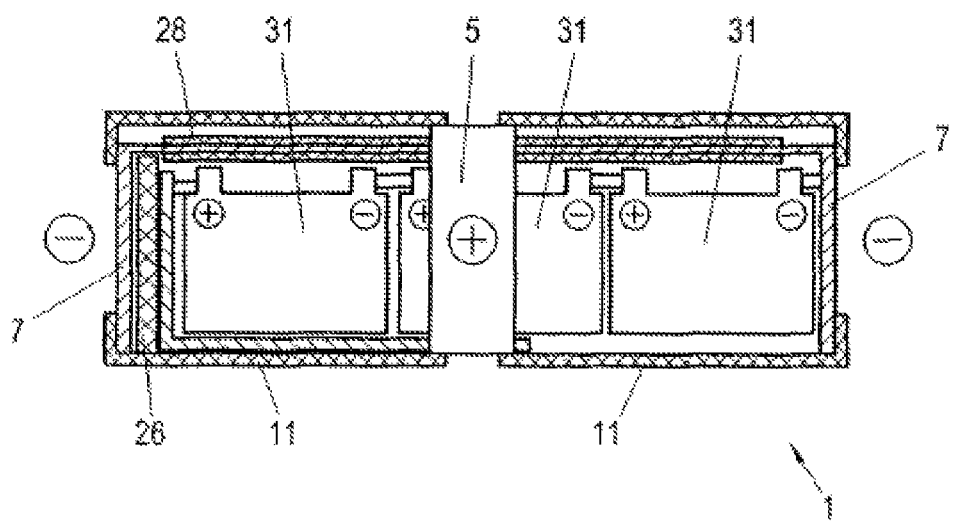
FIG. 12 shows in a section a power accumulator according to the invention with several (three) cells.

FIG. 12 schematically shows likewise in a section the internal operation of an electrical power accumulator 1 according to the invention with three individual cells 31 in series connection (for example, LiPos) to increase the voltage. Here, there are internal insulation inserts 26 and 28 and one insulating jacket 11 to the outside.

Figure 13:
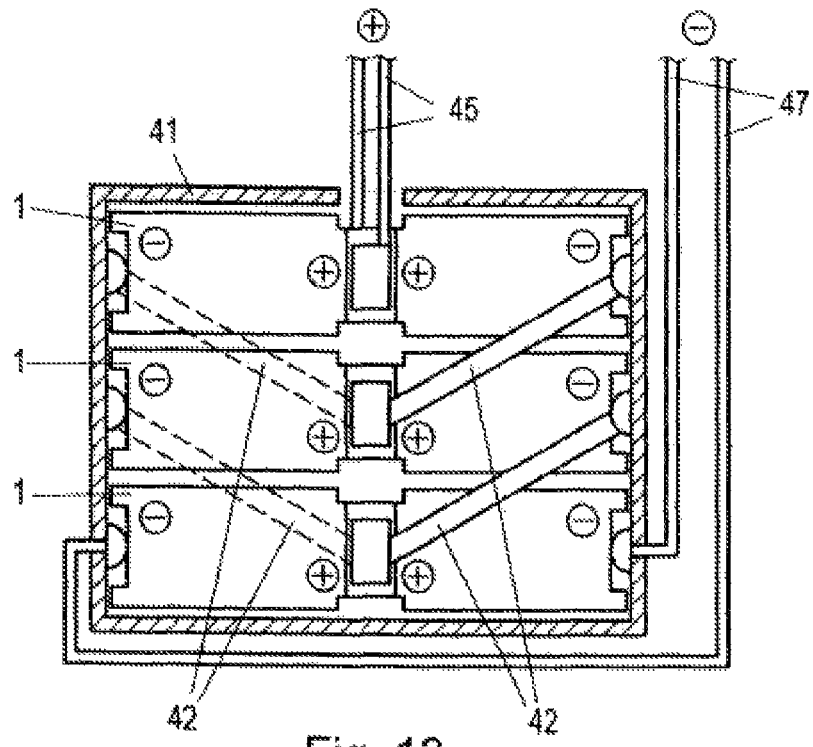
FIG. 13 shows a circuit for accommodating three power accumulators according to the invention in a battery box.
Figure 14:
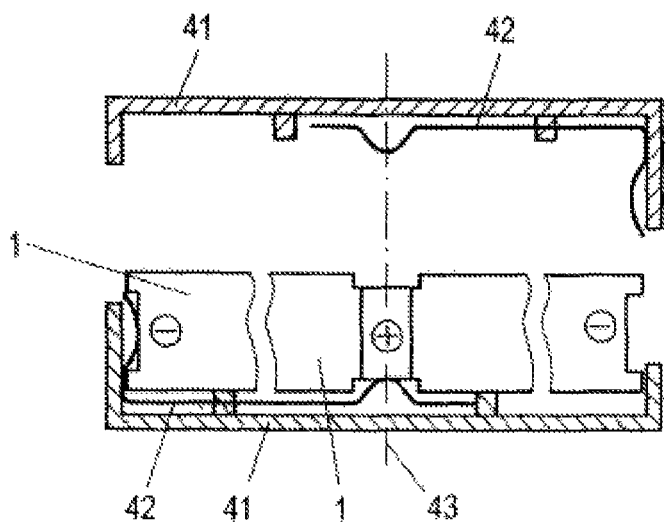
FIG. 14 is a section of the battery box from FIG. 13 for illustration of contacts that can be made doubled for box holding devices and other contact rails for power accumulators according to the invention, FIG. 15 in an oblique view shows another embodiment of a power accumulator according to the invention.

FIG. 13 schematically shows in a plan view and FIG. 14 schematically shows in a section as an example one box 41 ("battery box") for series connection of three power accumulators 1 according to the invention with the embodiment of FIG. 10. Here, the spring contacts 42 are made doubled both in FIG. 13 and also in FIG. 14 and thus show the optimum possibility of contact-making with the positive and negative contacts of a power accumulator 1 according to the invention.

FIG. 13 also shows that the cables 45 and 47 can be routed out of the box 41 in a doubled execution.

FIG. 14 additionally shows that the box can consist of two half shells that are symmetrical (mirrored and then turned by 180°) concentrically around the axis 43. This embodiment shows that simple boxes and holding devices are possible for the other variants of the power accumulators according to the invention, for example those that are shown in FIGS. 15 to 17.

In the embodiment shown in FIG. 10, the (negative) contacts 7 provided on the end surfaces of the power accumulator 1 are made countersunk relative to the end surfaces.

The jacketing of the power accumulator 1 of FIG. 10 can consist of (any) electrically insulating material and can be made either in one piece or assembled from several parts that are then connected to one another. The connection of the parts can take place by cementing or by bolting.

An arrangement is preferred in which the positive contact is made in the center and the negative contacts 7 are made symmetrically to the longitudinal center 3 and at a distance from it. An embodiment in which the negative contact is in the center and the positive contacts are on the ends of the electrical power accumulator 1 is also, of course, considered.

In the embodiment of an electrical power accumulator shown in FIG. 15, the contacts 7 are made cap-shaped on the ends of the electrical power accumulator 1 and projecting over the end surfaces of the power accumulator 1.

This embodiment is especially, but not exclusively, designed for the power accumulator according to the invention to be inserted via its contacts 7 into V-shaped mating contacts and to be able to be fixed by means of an internally conductive, externally insulated clamp downward over the contact 5. The recessed embodiment of the contacts 7 shown in FIG. 15 is not critical, but the side surfaces of the contacts 7 can also be aligned flat (flush) with the outer surfaces of the electrical power accumulator.

In the embodiment of a power accumulator 1 according to the invention shown in FIG. 16, the contacts 7 similarly to FIG. 15 are made cap-shaped, but made with side surfaces projecting over the outer surfaces of the power accumulator 1.

In the embodiment of a power accumulator 1 according to the invention shown in FIG. 17, the principles further explained above for the other embodiments apply. The embodiment shown in FIG. 17 is characterized in that there are several data tracks 9 (there can be one, two or more data tracks 9) for communication between the power accumulator 1 according to the invention with other electrical or electronic components. The symmetrically arranged contacts 5 and 7 here are both made doubled and are arranged symmetrically to the longitudinal center plane 3.

The variant embodiment shown in FIG. 17 has the advantage that the positive and negative contacts can always have the same distances from the longitudinal center plane 3 regardless of the effective length of the electrical power accumulator 1.

Figure 18:
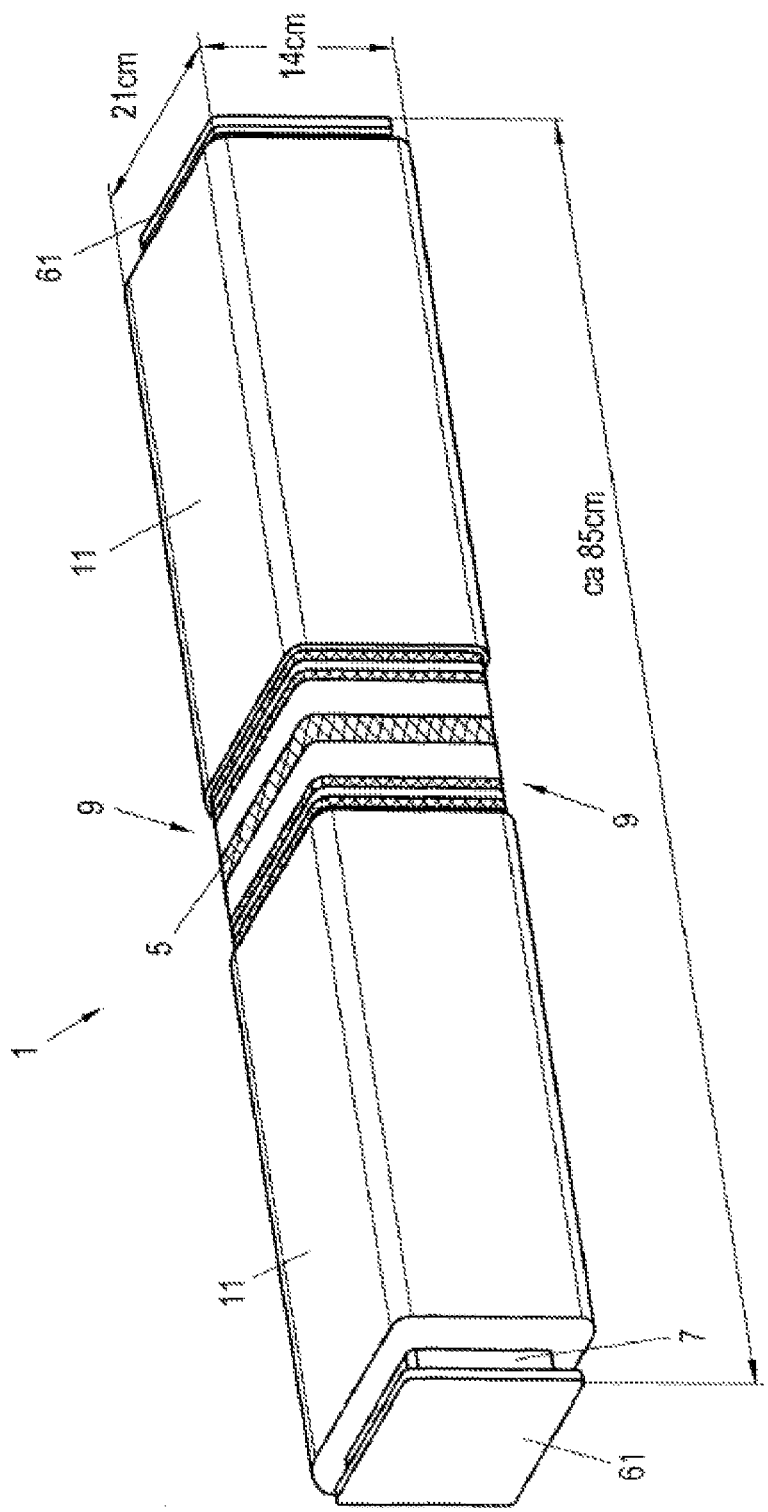
FIG. 18 shows another embodiment.
Figure 19:
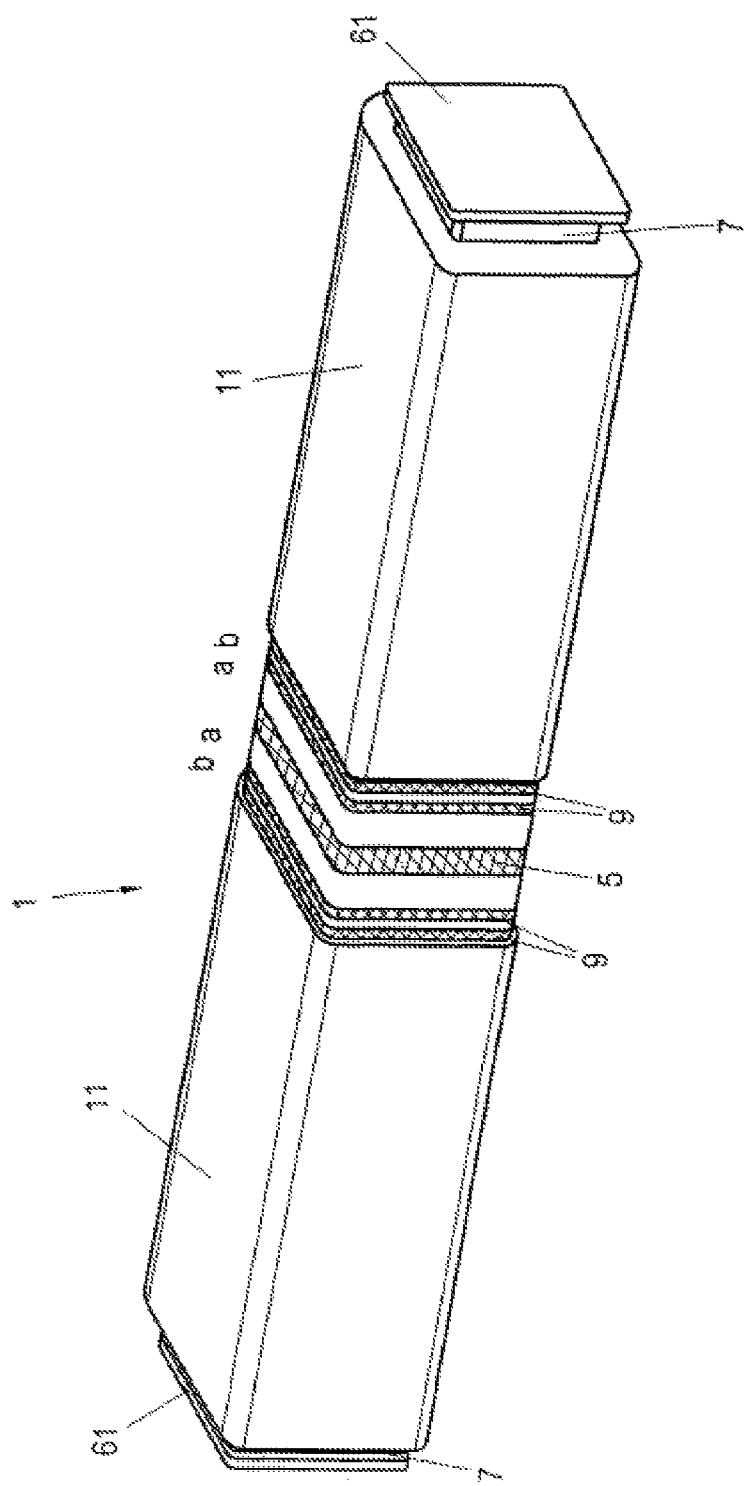
FIG. 19 shows the embodiment of FIG. 18 in another view.

FIGS. 18 and 19 show one embodiment of the power accumulator 1 that is made as a quick-change battery. In the example, the power accumulator 1 has a total length of roughly 85 cm and a rectangular cross-section in a side ratio of 2:3, for example, 14 cm×21 cm.

The power accumulator 1, for example, with the embodiment shown in FIGS. 18 and 19, has a defined, standard, nominal output voltage of, for example, 400 V, and a total output that is variable depending on the hardware and demand/battery type. Thus, the power accumulator 1 is designed, for example, at least for an output of 2 KWh or more each, at a planned maximum weight of roughly 25 kg.

The contact 5 that forms the plus pole is arranged in the center running peripherally in the plane of symmetry. The two contacts 9 for data transmission ("data tracks") are likewise arranged running peripherally and from the center symmetrically or doubled/mirrored (ba ab). Information (identification, battery type, load capacity or diverse states, demand for hot or cold air, etc.) is exchanged via these contacts 9 for optimization of the driving operation (but also for the internal charging process, for example in a space ("battery box") for accommodating power accumulators in an electric car), preferably with electronics assigned to the "battery box" ("box electronics") and/or the central driving and control electronics of an electric vehicle. Furthermore, via these data tracks 9 (alternatively to an induction or magnet design), the current contacts of the power accumulators 1 that are present in the "battery box" in the vehicle can be selectively activated/deactivated electrically by the "box electronics." Furthermore, operation-relevant data for a possible charging for use according to time, capacity use, charging cycles, etc., and data for battery care (internal and external peak values for charging/operation, etc.) or else also, for example, information for the necessary replacement of individual faulty cells in the power accumulator 1 can be made available.

The center piece with the contacts 5 and 9 is recessed relative to the divided outer jacket 11 of the power accumulator 1. The contact 7 (for example, the negative pole) is made doubled and is arranged symmetrically, peripherally and distinctly countersunk between the outer surfaces in the longitudinal axis and the closing plates 61.

Figure 20:
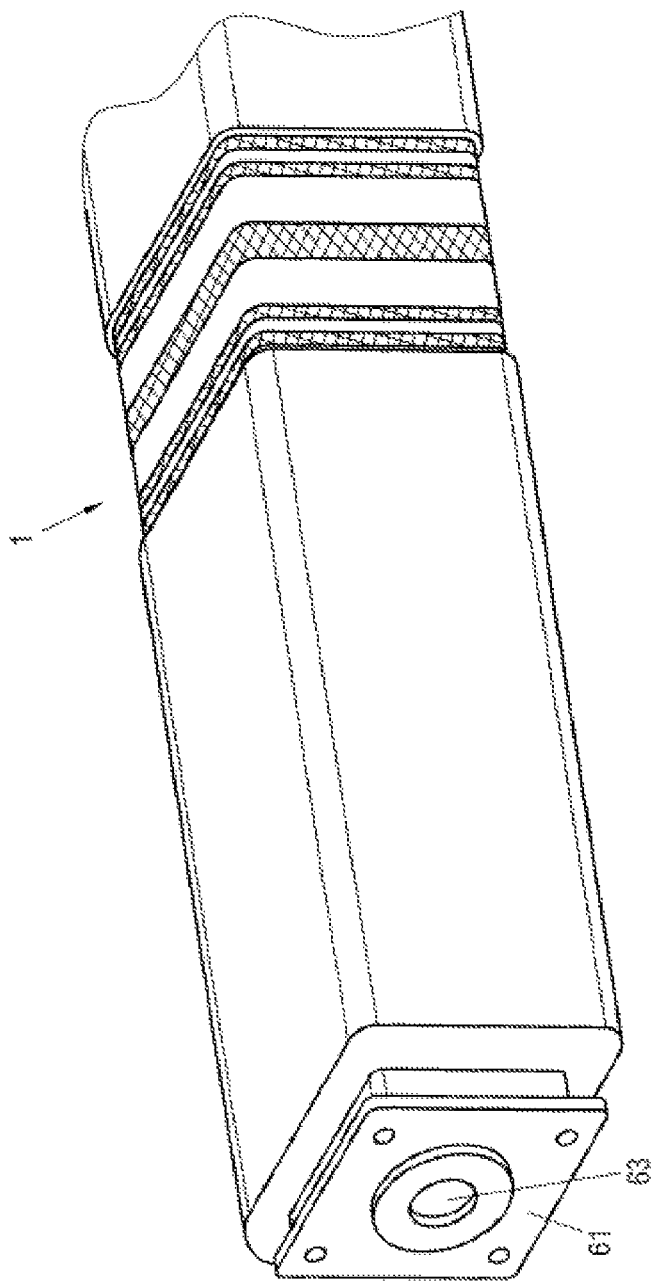
FIG. 20 shows one view of the closing plates with covering of the power accumulator of FIG. 18.

FIG. 20 shows a power accumulator 1 with a closing plate 61 that at the same time is used as a guide in a corresponding groove of a battery box when the power accumulator is inserted or removed, and a movable cover 63 that hermetically seals the power accumulator 1 from the inside.

It is considered that via two locking pins at a time to the left and right as parts of the battery box, the covers 63 are pressed into the power accumulator 1, its thus being kept securely, on the one hand, in the battery box in the correct position, and, on the other hand, at the same time a second activation stage (second safety stage) can be turned on via a pressure switch located behind.

Warm or cold air can be blown into the power accumulator 1 via the battery box or more precisely through lateral holes in hollow locking pins through the two openings that are produced here in the power accumulator 1, depending on need.

Figure 21:
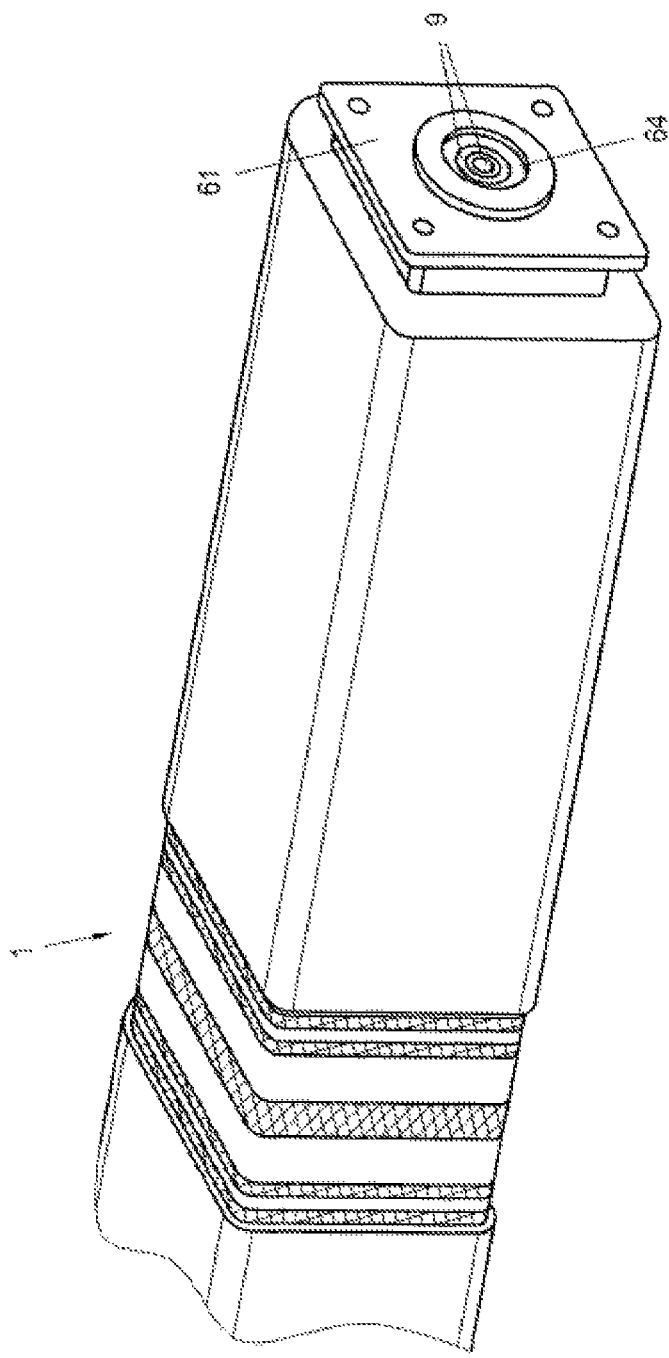
FIG. 21 shows one variant of the cover.

FIG. 21 shows one alternative embodiment of the power accumulator 1, in which the data tracks 9, instead of in the center, are integrated in the form of concentric contact circuits, in each case outside, into two covers 64. Thus, when the power accumulator 1 is fixed in a receiving space of a battery box, a connection to contacts on the front sides of the locking pins automatically results.

Figure 22:
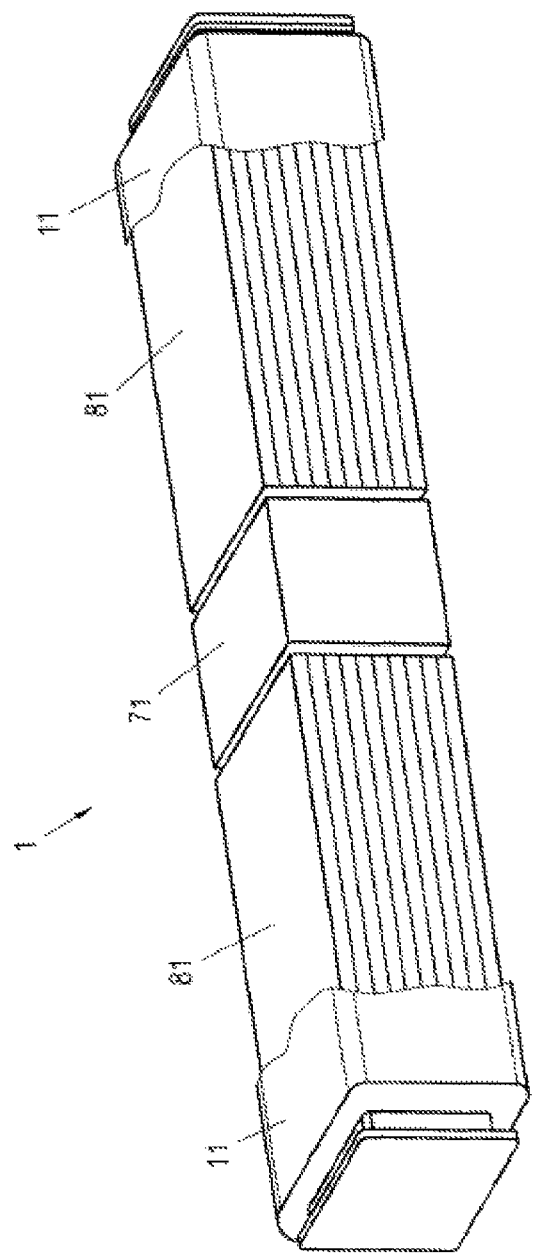
FIG. 22 shows a power accumulator with a partial outer jacket.

FIG. 22 shows a power accumulator 1 without illustration of the center contact(s) and with partially cutaway outer jackets 11. One possible arrangement of two components is recognizable, specifically two cell blocks 81 on either side of a central, electronic control unit 71 that is matched to the type and number of respective cells, within the power accumulator 1.

The cell blocks 81 in this embodiment consist of ten lithium-polymer (LiPo) cells each, for example, in a size of cells for electric cars (roughly 1 cm thick plates, roughly in A4 format and with two poles on one of the short sides) and therefore deliver 2×37 V=74 V nominal voltage in a combination in series circuit. One DC/DC converter can be used to achieve the required standard nominal voltage of 400 V.

In the central electronic control unit 71, among others, there are the (optionally inductive) selector switch for the function of the contacts 5 and/or 7 (which function can be placed on "inactive or active=output and charging input"), the suitable charger, a balancer/equalizer, preferably designed for "currentless balancing"—therefore independent of the charging process, the aforementioned DC/DC converter, diagnosis devices and fuses for the cells and the overall climate in the power accumulator 1 and preferably a data memory for the state and use of the cells, for example.

Figure 23:
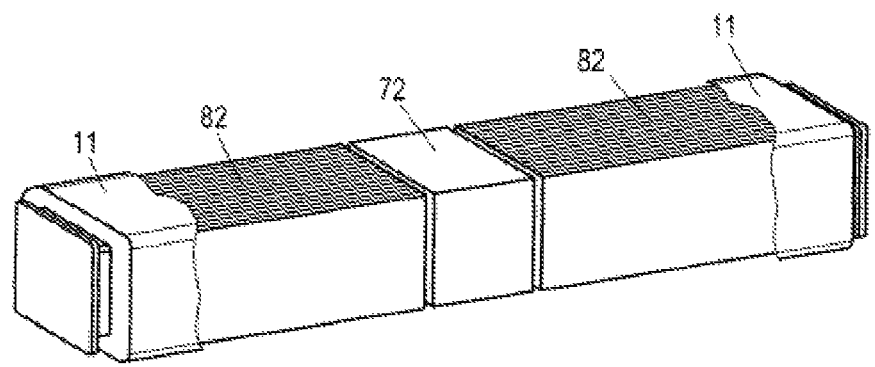
FIGS. 23 to 25 show variants of the power accumulator with the outer jacket partially broken away.
Figure 24:
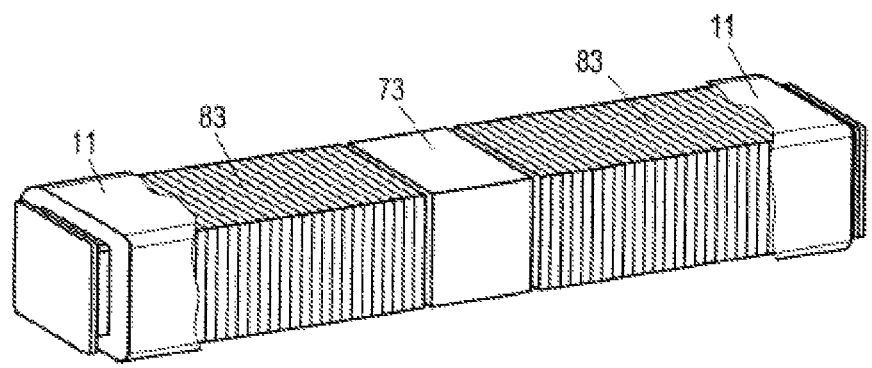

In a representation like FIG. 22 with the external shape and outer dimensions unchanged, FIGS. 23 and 24 show two variants of the cell shape with an altered number of cells within. This results in other total voltages in the battery blocks 82 and 83 and altered demands on the central electronic control units 72 and 73, especially with respect to the charger, balancer and DC/DC converter. The applicability/use in the receiving regions of an intelligent battery box in an electric car is, however, maintained without limitation by the standardized (required) availability of 400 V per power accumulator 1 of this design even for a total output that has been altered if need be.

Figure 25:
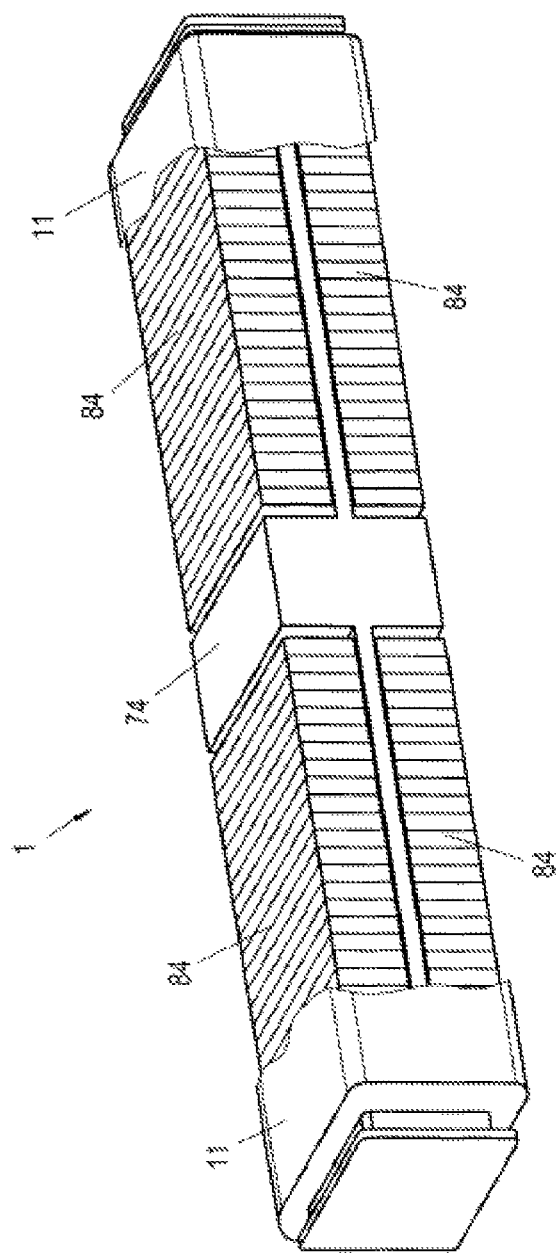

In a representation like FIG. 22 with the external shape and outer dimensions unchanged, FIG. 25 shows another variant based on the LiPo cell shape with pole contacts that are opposite on the narrow sides of the cuboidal individual cells 1. In this embodiment of a power accumulator 1, 27 cells at a time of 3.7 V/5 Ah each are combined in series into a cell block 84; for four blocks, this yields a total voltage of nominally 400 V (exactly 399.6 V!). Therefore, this also yields the required 400 V output voltage without a DC/DC converter and at a capacity of 5 Ah per LiPo cell an output of 2 KWh per power accumulator. The central electronic control unit 74 matched to this embodiment is designed such that the charger (the charging board), but especially the balancer unit, is arranged on either side of a central module between two cell blocks at a time. This fact and the special arrangement of the poles of the LiPo cells enables a very simple overall structure (in particular for the balancer, the cables to the individual cells can be integrated directly into the board, and the attachment of the cells directly on the reinforced board can be implemented at the same time with the connection of the cells in series). This simple, easily accessible structure also facilitates service and replacement of damaged cells. Primarily, however, this "airy structure"—the cell blocks 84 are arranged such that air can flow around them on all sides—also offers optimum possibilities for establishing optimum working conditions with hot or cold air blown in—from the left and right—(compare description to FIG. 20) for the power accumulator 1 without the need for moving parts such as, for example, fans in the power accumulator 1 itself.

In summary, one embodiment of the invention can be described as follows:

A power accumulator 1 has at least three contacts 5 and 7, the contacts 5 and 7 being partially positive contacts 5 and partially negative contacts 7. The contacts 5 and 7 are arranged symmetrically with respect to the external shape of the power accumulator 1, especially with respect to a longitudinal center plane 3 thereof. In this way, the power accumulator 1 can be inserted in any alignment into a device (consumer or charger) without the danger that the power accumulator 1 will be connected with incorrect polarity.

The invention claimed is:

1. A power accumulator having an elongated shape with opposite ends, comprising:
    at least one positive contact; and
    at least one negative contact,
    wherein the contacts having identical polarity are arranged symmetrically with respect to the external shape of the elongate power accumulator, the contacts being symmetrical with respect to a plane of symmetry, the plane of symmetry being a longitudinal center plane of the power accumulator perpendicular to a longitudinal axis of the power accumulator, and
    a pair of the contacts having identical polarity and arranged symmetrically are each disposed in end areas of the elongate power accumulator, the symmetrical arrangement of the pair of contacts with respect to the longitudinal center plane permitting either one of the opposite ends of the elongate power accumulator to be received into a same receiving portion of a power accumulator receiving device.

2. The power accumulator according to claim 1, wherein the pair of contacts having identical polarity are arranged at a distance from the plane of symmetry.

3. The power accumulator according to claim 1, wherein the power accumulator has a cross-sectional shape chosen from the group consisting of polygonal, rectangular, square, triangular, round and circular.

4. The power accumulator according to claim 2, wherein the pair of contacts that are arranged at a distance from the plane of symmetry project over the end surfaces of the power accumulator.

5. The power accumulator according to claim 2, wherein the pair of contacts that are arranged at a distance from the plane of symmetry are arranged countersunk in the end surfaces of the power accumulator.

6. The power accumulator according to claim 2, wherein the pair of contacts that are arranged at a distance from the plane of symmetry are arranged on one or more of end surfaces and bordering regions of an outer side of the power accumulator.

7. The power accumulator according to claim 1, wherein the contacts are arranged projecting over an outer surface of the power accumulator.

8. The power accumulator according to claim 1, wherein the contacts are arranged countersunk relative to an outer surface of the power accumulator.

9. The power accumulator according to claim 1, wherein the contacts lie in an outer surface of the power accumulator.

10. The power accumulator according to claim 1, further comprising, in the region of the plane of symmetry of the power accumulator, at least one other contact for access to a data memory located in the power accumulator.

11. The power accumulator according to claim 10, wherein the power accumulator comprises two of the contacts in the region of the plane of symmetry with the other contact for access to the data memory.

12. The power accumulator according to claim 1, wherein one or more of the contacts extend around the power accumulator.

13. The power accumulator according to claim 12, wherein at least the at least one negative contact extends around the power accumulator.

14. The power accumulator according to claim 12, wherein at least the at least one positive contact extends around the power accumulator.

15. The power accumulator according to claim 12, wherein at least one other contact for access to a data memory located in the power accumulator extends around the power accumulator.

16. The power accumulator according to claim 12, wherein contacts provided on the ends of the power accumulator extend around the power accumulator.

17. The power accumulator according to claim 12, wherein at least one of the contacts is located in the region of the center of the power accumulator and extends around the power accumulator.

18. The power accumulator according to claim 1, wherein the contacts are arranged symmetrically with respect to the longitudinal center plane of the power accumulator according to a type of the polarity of the contacts, the type of each contact being one of positive and negative.

19. The power accumulator according to claim 18, wherein the type of each contact being one of positive, negative, and data access for access to a data memory located in the power accumulator.

20. The power accumulator according to claim 1, wherein the external shape of the power accumulator is symmetrical with respect to the longitudinal center plane.

21. The power accumulator according to claim 1, wherein at least one additional contact of opposite polarity to the pair of contacts having identical polarity is disposed in the area of the longitudinal center plane.

22. A power accumulator having an elongated shape with opposite ends, comprising:
   at least one positive contact; and
   at least one negative contact,
   wherein the contacts having identical polarity are arranged symmetrically with respect to the external shape of the elongate power accumulator, the contacts being symmetrical with respect to a plane of symmetry, the plane of symmetry being a longitudinal center plane of the power accumulator perpendicular to a longitudinal axis of the power accumulator,
   a pair of the contacts having identical polarity and arranged symmetrically are each disposed in end areas of the elongate power accumulator, the symmetrical arrangement of the pair of contacts with respect to the longitudinal center plane permitting either one of the opposite ends of the elongate power accumulator to be received into a same receiving portion of a power accumulator receiving device,
   at least one additional contact of opposite polarity to the pair of contacts having identical polarity is disposed in the area of the longitudinal center plane, and
   at least the at least one negative contact and the at least one positive contact extend around the power accumulator.

* * * * *